United States Patent
Eid et al.

(10) Patent No.: US 11,508,898 B2
(45) Date of Patent: Nov. 22, 2022

(54) PIEZOELECTRIC DEVICES FABRICATED IN PACKAGING BUILD-UP LAYERS

(71) Applicant: Intel Corporation, Santa Clara, CA (US)

(72) Inventors: Feras Eid, Chandler, AZ (US); Shawna M. Liff, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 861 days.

(21) Appl. No.: 16/397,356

(22) Filed: Apr. 29, 2019

(65) Prior Publication Data
US 2019/0252597 A1  Aug. 15, 2019

Related U.S. Application Data

(62) Division of application No. 14/229,820, filed on Mar. 28, 2014, now Pat. No. 10,305,019.

(51) Int. Cl.
*H01L 41/053* (2006.01)
*H01L 41/23* (2013.01)
(Continued)

(52) U.S. Cl.
CPC ........ *H01L 41/0533* (2013.01); *H01L 41/047* (2013.01); *H01L 41/23* (2013.01);
(Continued)

(58) Field of Classification Search
CPC ... H01L 41/0533; H01L 41/047; H01L 41/23; H01L 41/332; H01L 41/094; H03H 9/10;
(Continued)

(56) References Cited

U.S. PATENT DOCUMENTS 7,148,756 B2 * 12/2006 Campana ............... H03H 11/30
                                                        331/34
7,211,933 B2 *  5/2007 Kawakubo ........... H03H 9/0542
                                                        310/366
(Continued)

FOREIGN PATENT DOCUMENTS

| TW | 2010-27641 | 7/2010 |
| TW | 2013-16681 | 4/2013 |
| TW | 2013-44909 | 11/2013 |

OTHER PUBLICATIONS

Taiwan Search Report for TW Counterpart Application No. 104105083 dated Feb. 16, 2016, 1 pg.
(Continued)

*Primary Examiner* — Emily P Pham
(74) *Attorney, Agent, or Firm* — Schwabe, Williamson & Wyatt P.C.

(57) ABSTRACT

Piezoelectric devices are described fabricated in packaging buildup layers. In one example, a package has a plurality of conductive routing layers and a plurality of organic dielectric layers between the conductive routing layers. A die attach area has a plurality of vias to connect to a microelectronic die, the vias connecting to respective conductive routing layers. A piezoelectric device is formed on an organic dielectric layer, the piezoelectric device having at least one electrode coupled to a conductive routing layer.

20 Claims, 5 Drawing Sheets

(51) Int. Cl.
  *H01L 41/047*  (2006.01)
  *H01L 41/332*  (2013.01)
  *H03H 9/10*  (2006.01)
  *H01L 41/09*  (2006.01)

(52) U.S. Cl.
  CPC ............. *H01L 41/332* (2013.01); *H03H 9/10* (2013.01); *H01L 41/094* (2013.01)

(58) Field of Classification Search
  CPC .............. H03H 9/1021; H03H 9/0542; H03H 2003/022; H03H 3/02
  See application file for complete search history.

(56) References Cited

U.S. PATENT DOCUMENTS

| | | | |
|---|---|---|---|
| 9,200,973 | B2 | 12/2015 | Lin et al. |
| 9,505,607 | B2 | 11/2016 | Lee et al. |
| 9,559,037 | B2 | 1/2017 | Eid et al. |
| 2004/0081498 | A1* | 4/2004 | Tu ............................ B41J 2/465 400/118.2 |
| 2005/0275695 | A1 | 12/2005 | Murata |
| 2011/0156406 | A1* | 6/2011 | Ma .......................... H02K 35/02 290/1 A |
| 2013/0134838 | A1* | 5/2013 | Yun ........................ H01L 41/047 29/25.35 |

OTHER PUBLICATIONS

U.S. Appl. No. 14/137,538; Sarah K. Haney, et al.; Hermetic Encapsulation for Microelectromechanical Systems (MEMS) Devices.
U.S. Appl. No. 14/141,875; Kyu Oh Lee, et al.; Integration of Pressure or Inertial Sensors Into Integrated Circuit Fabrication and Packaging.
Notice of Allowance for Taiwan Patent Application No. 104105083 dated Oct. 26, 2016, 3 pgs., with English Translation.
Office Action for Taiwan Patent Application No. 104105083 dated Feb. 16, 2016, 5 pgs., no Translation.

* cited by examiner

PIEZOELECTRIC DEVICES FABRICATED IN PACKAGING BUILD-UP LAYERS

CROSS-REFERENCE TO RELATED APPLICATIONS

This application is a division of U.S. patent application Ser. No. 14/229,820, filed on Mar. 28, 2014, the entire contents of which is hereby incorporated by reference herein.

FIELD

The present invention pertains to microelectronic device manufacturing and, in particular, to piezoelectric devices in organic packages.

BACKGROUND

Piezoelectric materials are used for devices that provide a range of useful functions in electronic platforms and particularly in mobile and wireless radio devices. Some of the devices include RF variable capacitors and sensors, such as ultrasonic transducers or motion sensors, energy harvesting circuits, and acoustic signaling systems. Piezoelectric materials typically require deposition at high temperatures such as temperatures over 400° C. that are not compatible with organic substrate manufacturing which is normally below about 250° C. As a result, the piezoelectric components are fabricated separately as discrete parts which are then assembled on to a suitable location in the system.

For a semiconductor or RF (Radio Frequency) chip package, the piezoelectric parts are often attached to the package substrate, embedded within the package, or placed adjacent to the package on the printed circuit board. For a system with a printed circuit board, these piezoelectric parts may be soldered or socketed into place on the board. This placement often produces an increase in the z height of the system and/or an increase in area sufficient to accommodate the assembly of the additional parts. In some instances a separate driver or a separate signal processing circuit or chip and routing may be needed as well and occupy even more space in x, y, and/or z directions.

DETAILED DESCRIPTION OF THE DRAWING FIGURES

Embodiments of the invention are illustrated by way of example, and not by way of limitation, in the figures of the accompanying drawings in which like reference numerals refer to similar elements.

DETAILED DESCRIPTION

Figure 1A:
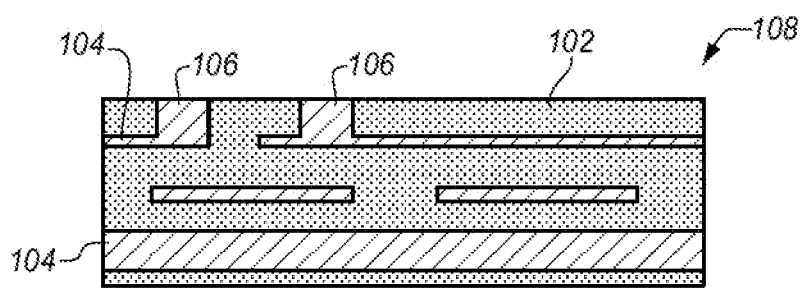
FIGS. 1A to 1D are side cross-sectional diagrams of operation stages of forming a piezoelectric device on a portion of a package substrate according to an embodiment.

Piezoelectric layers may be fabricated directly in a package as part of the substrate manufacturing process. Fabricating piezoelectric materials as part of the package enables new functionality such as RF variable capacitors, sensors, energy harvesting, acoustic signaling etc. with a small z height and form factor impact and enables novel, synergistic integration in the system. The assembly and integration of a separate sensor package is no longer necessary. New materials and fabrication processes allow these piezoelectric materials to be formed during the package build up process enabling in-situ piezoelectric-based sensors or devices. Forming piezoelectric layers directly in the package also provides a potential for direct and intimate routing to other devices in the package, such as a CPU or radio device or to driver or signaling logic that is integrated in the package.

FIGS. 1A to 1D are side cross-sectional diagrams of operation stages of forming a piezoelectric device on a portion of a package substrate. The figures show a process flow for creating a piezoelectric layer that vibrates out of plane (in the z direction which is the vertical direction up the page as shown in the drawing figures). The substrate may be made of any conventional organic substrate material or process such as a glass reinforced epoxy laminate like FR4 or an Ajinomoto Buildup Film (ABF).

In FIG. 1A, alternating layers of dielectric substrate material 102 and conductive routing layers 104 are formed one over the other to constitute a package substrate 108. The routing layers may be formed by photolithography, printing, deposition and laser milling, or in any of a variety of other ways. After the top routing layer and a top dielectric layer are formed, conductive vias 106 are formed in the standard substrate dielectric layer 102. The vias form an electrical connection from an appropriate routing layer, in this case the top routing layer 104, to the electrodes of a piezoelectric device that is to be formed over the top layer.

Any existing substrate manufacturing method, including standard core or BBUL (Bumpless Build Up Layer) technologies, may be used to create the package layers. The routing layers, vias, and electrodes may be formed of any of a variety of different materials including metals with good adhesion to an organic layer and to a piezoelectric layer. This metal may include copper with a seed layer and a surface finish to enhance adhesion.

Figure 1B:
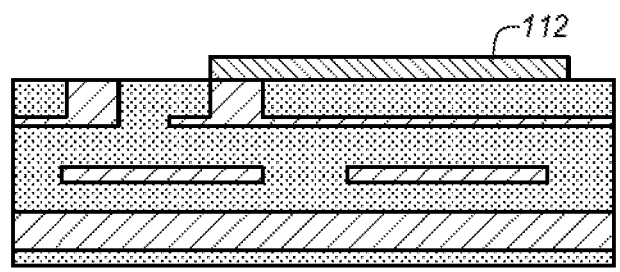

In FIG. 1B a first electrode of the piezoelectric device 112 is patterned and fabricated. The first electrode connects to a via 106 in the substrate. In the illustrated example, the first electrode is long and flat and covers an area of the top surface of the substrate.

Figure 1C:
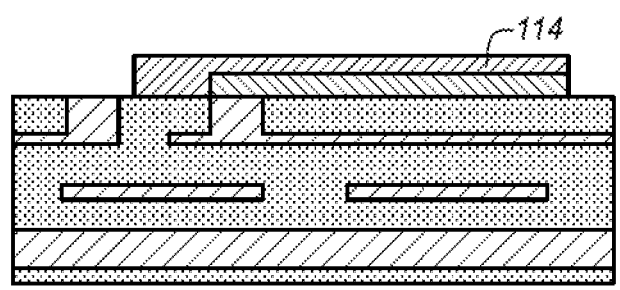

FIG. 1C shows that a piezoelectric layer 114 is deposited over the first electrode and patterned e.g. using photolithography technology. The first electrode as shown connects to a via at its left end. The piezoelectric layer may extend to the left beyond the end of the first electrode and touches the top dielectric layer of the substrate but does not necessarily make an electrical connection with any nearby routing layer. However, in some implementations, the piezoelectric layer may be grounded or coupled to some other voltage plane.

Figure 1D:
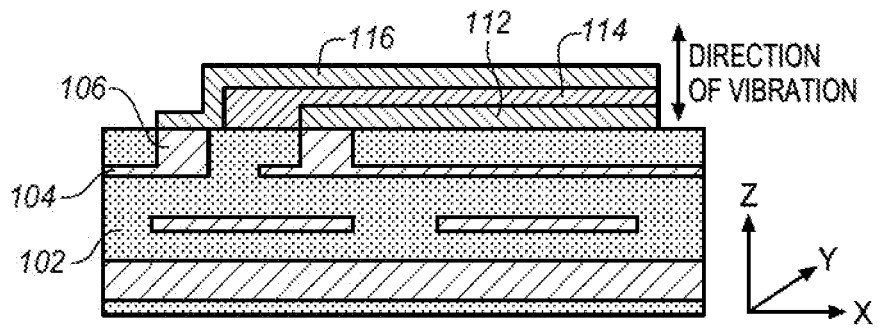

FIG. 1D shows that a second electrode 116 is deposited and patterned over the piezoelectric layer. The second electrode may extend to the left of the piezoelectric material and electrically connect with a second via of the substrate which connects to a different metal trace of the substrate. If the second electrode is not able to reach the via using conformal coverage of the topology next to the via on the left as shown, then the via may be connected in another way. As an example, the via may be extended first (e.g. by plating) so that its height matches that of the piezoelectric layer, followed by patterning and fabricating the second electrode.

The piezoelectric material 114 may be actuated by driving opposing voltages through the two electrodes 112, 116. An oscillating motion frequency or vibration may be induced by driving an oscillating voltage through the two electrodes. Alternatively, if the piezoelectric material is induced to move by an outside force, then a voltage is induced between the two electrodes. Using this reverse effect, a sensor or an energy harvester may be provided.

Figure 2A:
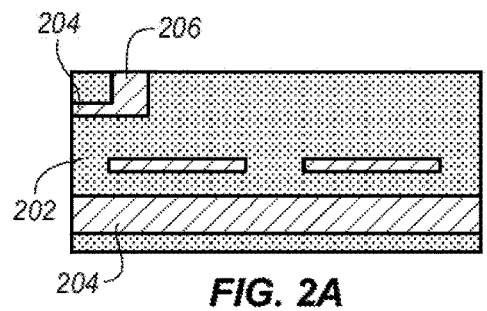
FIGS. 2A to 2C are side cross-sectional diagrams of operation stages of forming an alternative piezoelectric device on a portion of a package substrate according to an embodiment.
Figure 2D:
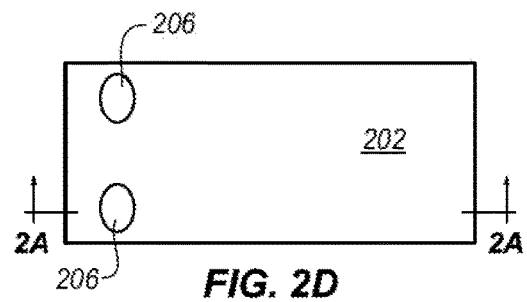
FIGS. 2D to 2F are top plan views of the operations stages of FIGS. 2A to 2C.
Figure 2B:
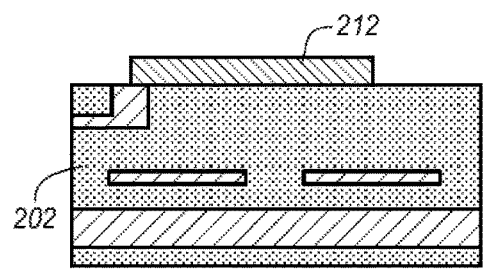
Figure 2E:
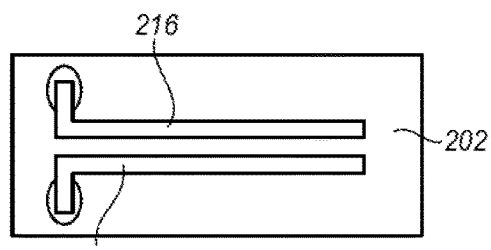
Figure 2C:
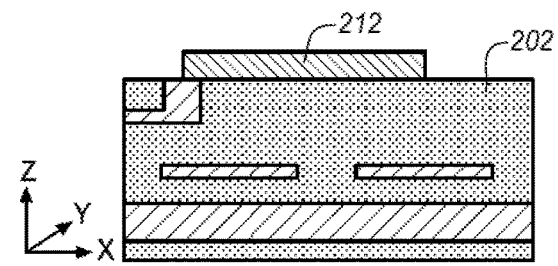
Figure 2F:
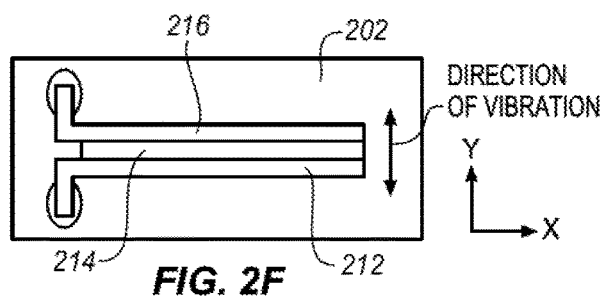

FIGS. 2A to 2C are similar side cross-sectional diagrams of operation stages of forming a piezoelectric device on a portion of a package substrate. The figures show a process flow for creating a piezoelectric layer that vibrates in-plane (in the x or y direction or in an out of the page as shown in the drawing figures). FIGS. 2D to 2F are corresponding top plan views of the process flow.

In FIG. 2A, the same kinds of substrate layers of dielectric substrate material 202 and conductive routing and interconnect layers 204 are shown as in FIG. 1A. The dielectric may be formed of any suitable substrate material. The conductive layers are patterned to form routing, interconnect, via and circuit components. The conductive material is typically copper, however, a variety of other materials may be used instead. Vias 206 are also formed that connect to appropriate routing layers. In FIG. 2D the two vias 206 are shown side-by-side to connect with two electrodes of the piezoelectric device.

In FIG. 2B, lateral electrodes 212, 216 are formed over a portion of the top of the substrate. The electrodes are shaped similarly to the two electrodes of FIG. 1D. Instead of being stacked vertically, they are placed side-by-side with a space, or gap in between. The electrodes may be formed at the same time of a suitable metal by depositing a metal layer and then etching away the excess metal using photolithography. The two electrodes are parallel with a space in between. The two elongated parallel electrodes may both be seen in the corresponding top view of FIG. 2E. Each electrode is connected to a different via 206.

In FIG. 2C, a piezoelectric layer 214 is deposited between the two electrodes. The piezoelectric is sandwiched laterally between the two electrodes. While the additional material is not visible in FIG. 2C, it is clearly visible in FIG. 2F.

The piezoelectric material 214 may be driven laterally, that is up and down the page in FIG. 2F, by driving opposing voltages through the two electrodes 212, 216. Similarly, if the piezoelectric material is induced to move by an outside force, then a voltage is induced between the two electrodes. Using this reverse effect, a sensor or an energy harvester may be provided.

In the examples of FIGS. 1D and 2F, the piezoelectric structures are formed directly over dielectric structures or over each other. The layers may therefore be adhered to these surfaces or may be hindered in their movement by friction against the substrate or other layers with which they are in contact.

In some applications, such as motion or ultrasonic sensors or energy harvesting as described in the above sections, it may be desirable to release the piezoelectric structure (and electrodes) after fabrication to allow motion with less friction against neighboring structures. The dielectric material surrounding the piezoelectric structure may be etched away to allow such movement. Additional layers may also be formed over the piezoelectric structure without harming the structure or restricting motion. In some applications, for example as an RF variable capacitor, the piezoelectric material does not have to be released from the underlying substrate structures to be utilized.

FIGS. 3A to 3D are side cross-sectional diagrams of operation stages of releasing a piezoelectric device formed on a portion of a package substrate. The figures show a process flow for removing material around a piezoelectric layer that vibrates out of plane. Although the process flow shown is for the release of the out of plane piezoelectric device of FIG. 1D, the flow is identical for releasing the in-plane structure of FIG. 2F. Also note that the final released structure is a cantilever in this example, but it can also be designed to be any different mechanical structure (such as a doubly clamped beam or a diaphragm etc).

Figure 3A:
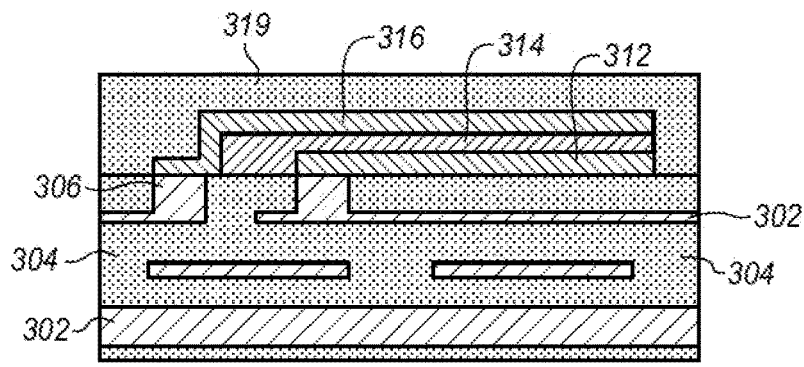
FIGS. 3A to 3D are side cross-sectional diagrams of operation stages of releasing a piezoelectric device formed on a portion of a package substrate according to an embodiment.

FIG. 3A shows the structure of FIG. 1D with a piezoelectric material 314 between two electrodes 312, 316. The electrodes are coupled to vias 306 to apply or receive a voltage or both, depending on the particular implementation. The vias are coupled to metal layers 302 among multiple metal or conductive redistribution or wiring layers 302 within a substrate material. An additional dielectric layer 319 is laminated directly on top of the piezoelectric structure including the electrodes 312, 316. While there may be intermediate layers between the dielectric layer and the piezoelectric structure, in this case the dielectric is formed directly over the piezoelectric structure.

Figure 3B:
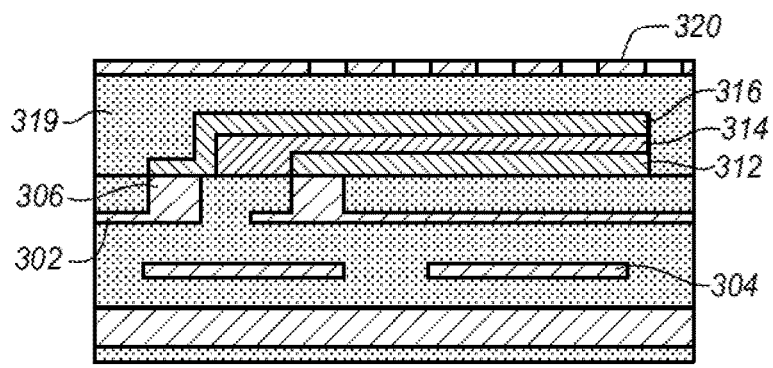

In FIG. 3B, a mesh layer 320 is created using substrate technology. The mesh layer protects the piezoelectric structure from mechanical interference. It prevents any additional layers from being formed on the piezoelectric structure. The mesh may be formed in any of a variety of different patterns. In one example, it is formed of intersecting (e.g. orthogonal) copper traces anchored by vias (not shown). Alternatively, the mesh may be formed as solid plate with many holes. The mesh may be formed using photolithography and plating and etching or any other combination of substrate patterning technique.

Figure 3C:
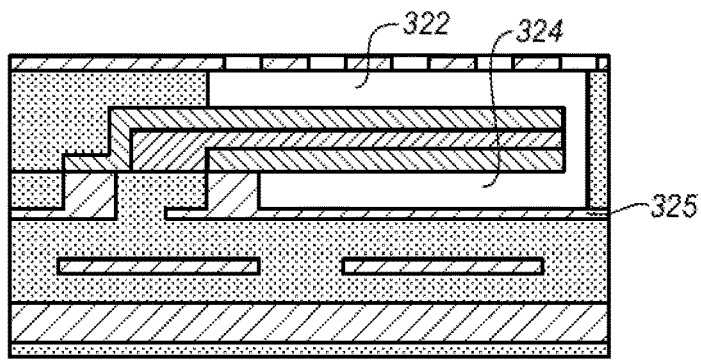

In FIG. 3C, photolithography and etching (e.g. RIE, Reactive Ion Etch) is used to remove the dielectric (e.g. organic) material around the piezoelectric structure. This may be done through the mesh without affecting the mesh or the metal layers. The dry etch forms a cavity above 322 and below 324 the piezoelectric structure. The cavity is defined by the distance between the piezoelectric structure and the remaining dielectric and metal layers. The cavity allows the piezoelectric structure to move freely within the substrate. The cavity may be filled with air or any other material to control the amount of movement of the structure. In other words, there is a gap or distance between the piezoelectric structure and the substrate. The cavity allows the structure to move or deflect within that gap.

The gap etched below the piezoelectric structure is stopped by the metal layer 325 directly below the structure. The extent of the etch from side-to-side as shown in the drawing is controlled by the photolithography mask and/or the metal mesh that is applied before the etching begins. The size of the cavities is controlled therefore by the metal structures of the substrate and the mesh and the photolithography process. The cavity size and, in particular, the amount of the beam that is not firmly anchored by dielectric or metal, allows the free movement of the piezoelectric structure to be controlled. This allows the structure to be tuned or its operation to be adjusted.

The extent of the dielectric removal (in the z-direction) may also be controlled either using a timed etch or an inorganic etch stop, such as a thin SiN layer, deposited initially at the bottom of the desired cavity.

Figure 3D:
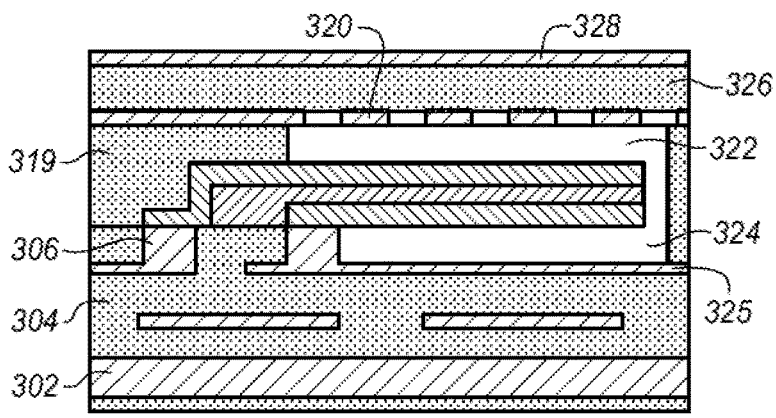

In FIG. 3D, the fabrication of the package layers continues. Additional layers may be deposited on top of the mesh to form additional routing or wiring. The mesh is able to support subsequent package layers (e.g. dielectric or solder resist) with minimal sagging. In the illustrated example, a dielectric layer 326 is formed over the mesh followed by a patterned metal layer 328. The particular configuration and number of the layers may be adapted to suit the intended purpose of the end device.

The above examples describe the fabrication of a piezoelectric element by deposition, pattern, and etch with routing connections adjoined below the piezoelectric. The piezoelectric may also be deposited first and the routing connections adjoined from atop. While this deposition, pattern and etch process is effective for some materials, other materials may be pre-formed and then placed on the substrate. The electrodes may be formed after the piezoelectric material is placed in order to ensure a connection. Alternatively, the electrodes may also be fabricated in an external process and connected to the piezoelectric material before it is installed on the substrate.

Some materials, such as inorganic piezoelectric materials may require additional processing operations to provide the intended piezoelectric properties. As an example, for PZT, after the material is deposited (e.g. via sputter), it may be nucleated and crystallized using excimer pulse laser heating. This may alternatively be done in an external process before the structure is applied to the substrate.

The above examples describe the fabrication of a unimorph in the form of a symmetric cantilever or diaphragms containing a single layer of piezoelectric material with surrounding electrodes. In some applications, two or more active layers of piezoelectric materials may be used with symmetric or asymmetric thicknesses to create bimorphs or stacks. The additional piezoelectric layers may be used to increase the force or displacement output, for example, of an electrically driven structure, beyond what a unimorph provides. The second active layers may be patterned in the same manner that the first layer was deposited. For an in-plane oscillator a subsequent resist application, patterning, and strip may be used to allow for different piezoelectric materials.

The examples herein may be used with a variety of different piezoelectric materials. Some examples are listed below.

Synthetic organic piezo-electric materials include but are not limited to polymers like poly(vinylidene fluoride), polyparaxylene, poly-bischloromethyuloxetane, aromatic polyamides, polysulfone, polyvinyl fluoride (including PVDF), poly-L-lactic acid and synthetic polypeptides.

Natural piezoelectric materials include but are not limited to quartz, topaz, sugar cane, deoxyribonucleic acid (DNA), ribonucleic acid (RNA), tendon, bone, dentine enamel, Rochelle salt, Schorl tourmaline, wood, keratin, silk, and myosin Synthetic man made piezoelectric inorganics include but are not limited to barium titanate, lead titanate, lead zirconate titanate (PZT), potassium niobate, lithium niobate, aluminum nitride, zinc oxide, and lithium tantalate.

TABLE

| | Material | | |
|---|---|---|---|
| | $BaTiO_3$ | PZT | PVDF |
| $d_{31}$ ($10^{-12}$ C/N) | 78 | 110 | 12 |
| Curie $T_c$ or Melting $T_m$ | 115° C. $T_c$ | 190-350° C. $T_c$ | 117-180° C. $T_m$ |

The Table shows three examples of representative materials and their performance and thermal compatibility. The second row shows the piezoelectric coupling coefficient between the material's mechanical and electrical parameters along certain orientations in newtons per coulomb. The third row refers to the temperature at which the material loses it piezoelectric effect or spontaneous polarization, either the Curie temperature or melting point.

The synthetic organic materials introduced above have inferior coupling coefficients in comparison to the man-made inorganics and often do not survive processing temperatures typical of microelectronic substrate fabrication and subsequent assembly processing. This is because the piezoelectric effect in organic materials is proportional to the crystallinity and alignment of the crystalline domains within the amorphous matrix. Consequently, crystalline orientation induced during deformation such as drawing or extruding (e.g. into laminate sheets) or induced via electrical poling can be lost when the material is exposed to temperatures above the material's softening temperature even if the material is covalently cross-linked. Furthermore, when exposed to temperatures in excess of the melting point, the crystallites will melt and kinetics may limit their reformation. In contrast the crystallinity in the man-made inorganic piezoelectric materials is achieved through high temperature annealing, often in conjunction with electrical poling, which often exceeds the degradation temperatures typical of the dielectric materials used to fabricate microelectronic packages.

Consequently, at least three different approaches may be used to include piezoelectric material in the organic package. The first approach relies on micro-transfer of pre-fabricated man-made inorganic piezoelectric material. In this instance a thin film of piezoelectric material may be grown on a silicon substrate or metal foil and then released through an etch step. These structures can then be transferred to the panel using soft-lithography and a PDMS (polydimethylsiloxane) stamp for pick-up and placement of the piezo-electric material. Good adhesion and electrical contact with the metal vias fabricated in the package and to the underlying dielectric layer may be achieved through proper selection of materials, thermal anneal, and laser spot welding, among other techniques.

The second approach relies on low temperature deposition (i.e. room temperature to reflow temperatures up to ~250° C.) of man-made inorganic piezoelectric materials and pulsed laser annealing of the material to induce crystallinity either as deposited or as a subsequent process step. Laser pulsed deposition may be used after materials are applied to the substrate panel via slit or spray coating of a sol-gel formulation or via sputter and may be applied in conjunction with electrical poling to further align crystallites in the direction of interest. In some instances the seed/adhesion under-layer may be tuned to withstand and enable laser absorptive heating and quick dissipation.

The third approach uses extrusion, with or without in situ electric field application, of a covalent adaptable polymeric network blended with organic piezoelectric high temperature, crystallite-forming molecules (e.g. polysulfone) and/or nano- and/or micro-piezoelectric inorganic particles, tubes or fibers, such as carbon nanotubes. These materials may be extruded as single or multiple layers to induce orientation, or co-extruded to deliver bimorphic multi-layer piezoelectric materials and then laminated atop the organic substrate panel like a typical dielectric build-up layer. These extruded laminates could be provided with custom adhesive and/or anisotropically conductive layers on the outside layer for good coupling to the under-layer. Note that covalent adaptable networks (CANs) are those cross-linked networks that have triggerable, reversible chemicals throughout the network that upon stimulation adjust their structure through reversible addition/condensation reaction or through bond exchange mechanisms. Triggers include temperature change, irradiation at a specific wavelength, pH or the presence of another specific molecule. One embodiment may include CAN that behaves as a semi-crystalline thermoplastic polymer network upon extrusion but. upon photo-exposure, a molecule in the network changes conformation and induces covalent-crosslinking amid the matrix prior to lamination on the organic substrate panel.

Resonating cantilevers and beams in organic substrates offer higher quality factors (Q) in air than traditional silicon MEMS (Micro Electro-Mechanical Systems) and can be tailored to provide a wider bandwidth, which makes them ideal candidates for piezoelectric energy harvesting. In energy harvesting applications, having a large bandwidth and high Q allows more energy to be harvested at a wider range of input mechanical frequencies. An ultra-wide bandwidth piezo-electric energy harvester using a doubly clamped beam as described herein may be used to provide a power density up to 40 W/cm3, an order of magnitude better performance than previously reported devices.

Figure 4:
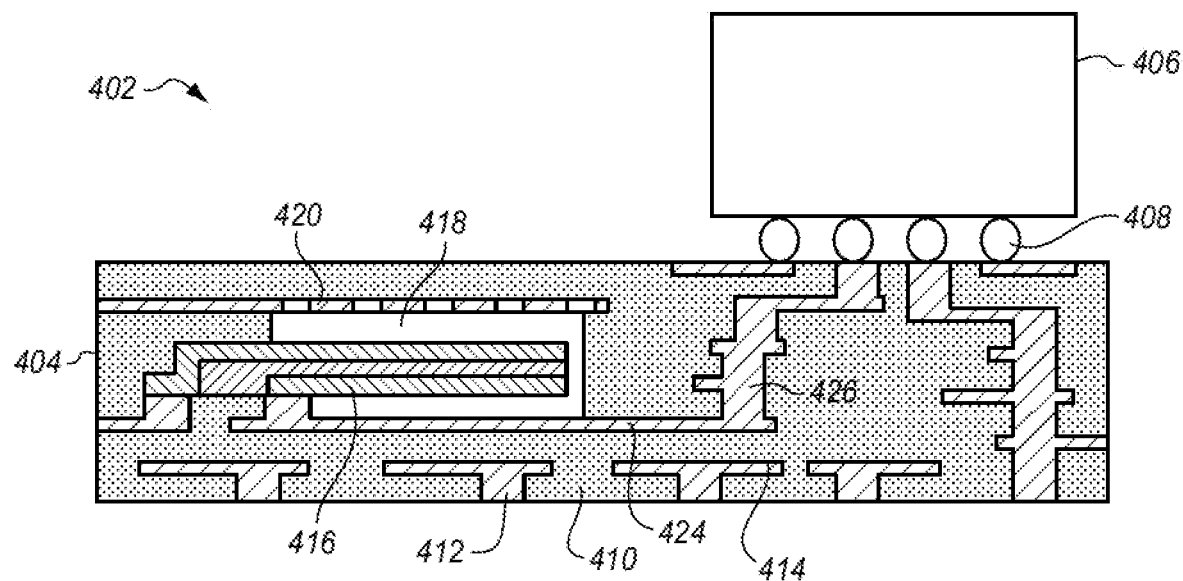
FIG. 4 is a cross-sectional side view of flip-chip package with an integrated piezoelectric device according to an embodiment.

A variety of different types of packages may be made using substrates as described herein. FIG. 4 is a cross-sectional side view diagram of a flip-chip package with an integrated piezoelectric device. The package 402 has substrate 404 to which a die 406 has been attached. The die is flipped so that the top layer interconnects are coupled through a solder bump array 408 or any other desired type of connection. The die may be any of a variety of different types, a semiconductor circuit die, a micro-electromechanical die, an optical die, a radio frequency analog die, a digital processor die, or any other type of die that may benefit from the proximity of the piezoelectric device. One benefit of the proximity of the piezoelectric device is that it may connect directly to the die with a fast low loss metal layer and via connection through the substrate. Another benefit is that a system may be made more compact by including disparate components in a smaller space.

The substrate has a dielectric main body 410 and metal contact pads 412 to connect with a main system or subsystem board (not shown). The pads connect to conductive layers 414 to connect and route signals and power through the substrate between the system board and the die.

A piezoelectric device 416 is formed on or in the substrate 404 as described herein and connects through electrodes to metal layers of the substrate. In addition, the piezoelectric device also connects directly to the die through the metal routing layers 424 and associated vias 426 in the substrate. Alternatively, the piezoelectric device may instead be connected to external components though the contact pads to the system board. In the illustrated example the piezoelectric device 416 is suspended as a beam over a cavity 418 covered by a metal mesh layer 420. The piezoelectric device is not necessarily shown to scale and may be far smaller than shown. The package may be covered, embedded, sealed, or otherwise protected, depending on the particular implementation.

Figure 5:
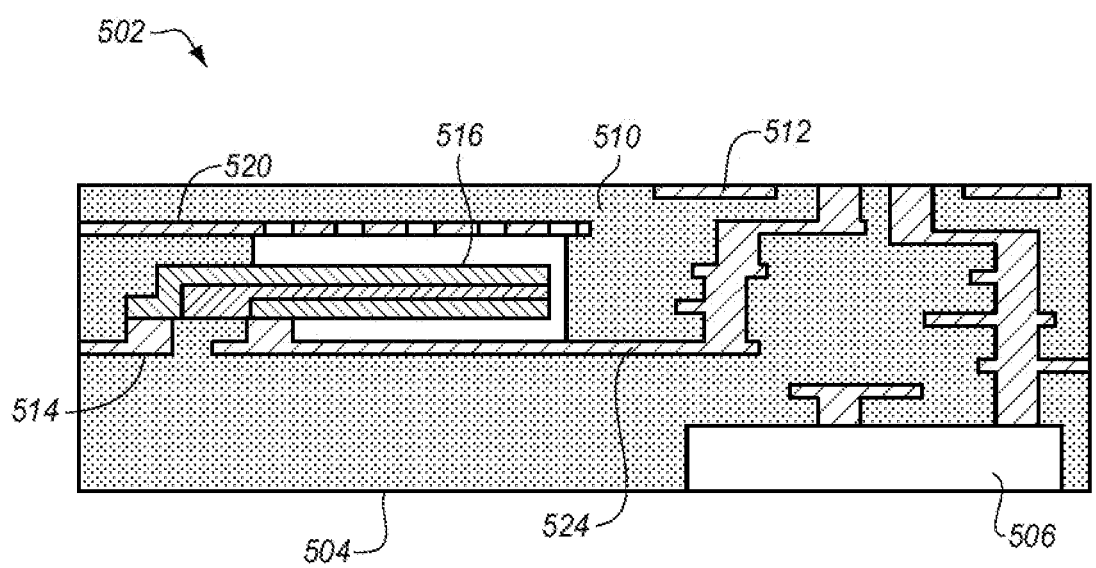
FIG. 5 is a cross-sectional side view of an embedded die package with an integrated piezoelectric device according to an embodiment.

FIG. 5 is a cross-sectional side view diagram of an alternative embedded die package with an integrated piezoelectric device. The package 502 has a substrate 504 in which a die 506 has been embedded. The die connects with vias inside the package and may also have outer connections such as a solder bump array (not shown) to attach to a system or sub-system board. The substrate has a dielectric main body 510 and metal contact pads 512 to connect with a main system or subsystem board (not shown). The pads connect to a conductive layer 514 to connect and route signals and power through the substrate between the system board and the die.

A piezoelectric device 516 is formed on or in the substrate 504 as described herein and connects through electrodes to metal layers of the substrate. Alternatively, the piezoelectric device may connects to the die through the metal routing layers 524 in the substrate as in FIG. 4. The package may also be covered, embedded, sealed, or otherwise protected, depending on the particular implementation.

Figure 6:
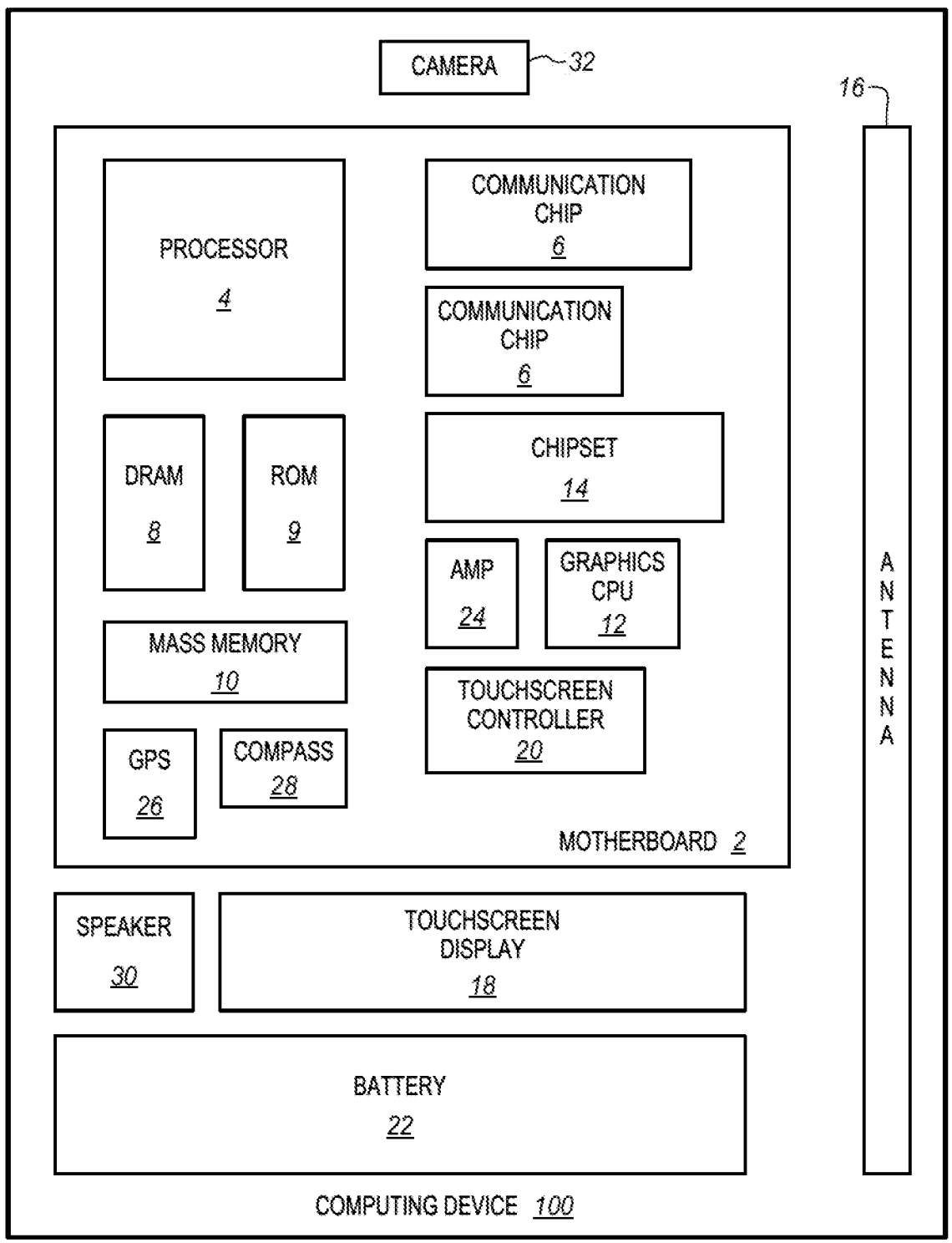
FIG. 6 is a block diagram of a computing device incorporating a tested semiconductor die according to an embodiment.

FIG. 6 illustrates a computing device 100 in accordance with one implementation of the invention. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as a hard disk drive) 10, compact disk (CD) (not shown), digital versatile disk (DVD) (not shown), and so forth. These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. In some implementations of the invention, the integrated circuit die of the processor, memory devices, communication devices, or other components include one or more dies that packaged with piezoelectric devices, if desired. Piezoelectric devices may also be incorporated into separate substrates apart from any die. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to system having a plurality of conductive routing layers, a plurality of organic dielectric layers between the conductive routing layers, a die attach area having a plurality of vias to connect to a microelectronic die, the vias connecting to respective conductive routing layers; and a piezoelectric device formed on an organic dielectric layer, the piezoelectric device having at least one electrode coupled to a conductive routing layer.

In some embodiments the electrode is coupled to the conductive routing layer through a via. In some embodiments the electrode is formed over the via. In some embodiments the piezoelectric device comprises an elongated piezoelectric material portion having two sides and the at least one electrode comprises an elongated electrode portion on each side of the elongated piezoelectric material portion.

Some embodiments further include a first electrode formed over a dielectric layer, the piezoelectric material is formed over the first electrode, and a second electrode is formed over the piezoelectric material.

Some embodiments further include a cavity between the piezoelectric device and the dielectric layers to allow the piezoelectric device to move.

In some embodiments the piezoelectric device is a cantilever beam. In some embodiments the organic dielectric layers are formed of an Ajinomoto Buildup Film.

Some embodiments pertain to a method that includes forming a plurality of organic dielectric layers, forming a plurality of patterned conductive layers between the dielectric layers, forming a plurality of vias to connect a part of one conductive layer to a part of another conductive layer, forming a die attach area to attach a die over a dielectric layer, and forming a piezoelectric device over coupled to a conductive layer.

Some embodiments further include forming an additional dielectric layer over the piezoelectric device. Some embodiments further include forming a metal mesh over the piezoelectric device and forming over the additional dielectric layer over the metal mesh. Some embodiments further include removing a portion of the additional dielectric layer under the metal mesh and around the piezoelectric device to allow the piezoelectric device to move.

In some embodiments the piezoelectric device is formed from a lead zirconate titanate component as a piezoelectric structure and copper components as electrodes. In some embodiments the piezoelectric structure and the electrodes are elongated to form a cantilever beam. In some embodiments forming a piezoelectric device comprises depositing a piezoelectric material over a dielectric layer and patterning the deposited material using photolithography. In some embodiments forming a piezoelectric device comprises depositing a piezoelectric material over a dielectric layer and annealing the piezoelectric material using laser pulses.

Some embodiments further include etching part of a dielectric layer from around the piezoelectric device to form a cavity around the piezoelectric device. In some embodiments the cavity forms an air gap.

Some embodiments pertain to a computing device that includes a motherboard, a memory device attached to the motherboard, and a logic device attached to the motherboard, the logic device including a semiconductor die and a package substrate to which the semiconductor die is attached, the package substrate having a plurality of conductive routing layers, a plurality of organic dielectric layers between the conductive routing layers, a die attach area having a plurality of vias to connect to a microelectronic die, the vias connecting to respective conductive routing layers, and a piezoelectric device formed on an organic dielectric layer, the piezoelectric device having at least one electrode coupled to a conductive routing layer. In some embodiments the piezoelectric device is an energy harvester.

What is claimed is:

1. A method comprising:
    forming a plurality of organic dielectric layers;
    forming a plurality of patterned conductive layers between ones of the plurality of organic dielectric layers;
    forming a plurality of vias to connect a part of one conductive layer of the plurality of conductive layers to a part of another conductive layer of the plurality of conductive layers;
    forming a die attach area to attach a die over an organic dielectric layer of the plurality of organic dielectric layers; and
    forming a piezoelectric device on an organic dielectric layer of the plurality of organic dielectric layers, the piezoelectric device coupled to a conductive layer of the plurality of conductive layers.

2. The method of claim 1, further comprising forming an additional dielectric layer over the piezoelectric device.

3. The method of claim 2, further comprising forming a metal mesh over the piezoelectric device and over the additional dielectric layer.

4. The method of claim 3, further comprising removing a portion of the additional dielectric layer under the metal mesh and around the piezoelectric device to allow the piezoelectric device to move.

5. The method of claim 1, wherein the piezoelectric device is formed from a lead zirconate titanate component as a piezoelectric structure and copper components as electrodes.

6. The method of claim 5, wherein the piezoelectric structure and the electrodes are elongated to form a cantilever beam.

7. The method of claim 1, wherein forming a piezoelectric device comprises depositing a piezoelectric material over an organic dielectric layer of the plurality of organic dielectric layers and patterning the deposited material using photolithography.

8. The method of claim 1, wherein forming a piezoelectric device comprises depositing a piezoelectric material over an organic dielectric layer of the plurality of organic dielectric layers and annealing the piezoelectric material using laser pulses.

9. The method of claim 1, further comprising etching part of an organic dielectric layer of the plurality of organic dielectric layers from around the piezoelectric device to form a cavity around the piezoelectric device.

10. The method of claim 9, wherein the cavity forms an air gap.

11. A computing device comprising:
    a motherboard;
    a memory device attached to the motherboard; and
    a logic device attached to the motherboard, the logic device including a semiconductor die and a package substrate to which the semiconductor die is attached, the package substrate having a plurality of conductive routing layers, a plurality of organic dielectric layers between the conductive routing layers, a die attach area having a plurality of vias to connect to a microelectronic die, the plurality of vias connecting to respective conductive routing layers, and a piezoelectric device formed on an organic dielectric layer, the piezoelectric device having at least one electrode coupled to a conductive routing layer of the plurality of conductive layers.

12. The computing device of claim 11, wherein the piezoelectric device is an energy harvester.

13. The computing device of claim 11, wherein the electrode is coupled to the conductive routing layer through a via.

14. The computing device of claim 13, wherein the electrode is formed over the via.

15. A computing device comprising:
    a motherboard;
    a memory device attached to the motherboard; and
    a logic device attached to the motherboard, the logic device including a semiconductor die and a package substrate to which the semiconductor die is attached, the package substrate having a plurality of conductive routing layers, a plurality of organic dielectric layers between the conductive routing layers, a die attach area having a plurality of vias to connect to a microelectronic die, the plurality of vias connecting to respective conductive routing layers, and a piezoelectric device having a first portion formed on an organic dielectric layer and a second portion above a cavity, the piezoelectric device having at least one electrode coupled to a conductive routing layer of the plurality of conductive layers.

16. The computing device of claim 15, wherein the piezoelectric device is an energy harvester.

17. The computing device of claim 15, wherein the electrode is coupled to the conductive routing layer through a via.

18. The computing device of claim 17, wherein the electrode is formed over the via.

19. The computing device of claim 15, wherein the piezoelectric device comprises an elongated piezoelectric material portion having two sides and wherein the at least one electrode comprises an elongated electrode portion on each side of the elongated piezoelectric material portion.

20. The computing device of claim 15, wherein the piezoelectric device is a cantilever beam.

* * * * *